(12) United States Patent
Maeda et al.

(10) Patent No.: US 7,323,923 B2
(45) Date of Patent: Jan. 29, 2008

(54) DRIVER CIRCUIT

(75) Inventors: Eisaku Maeda, Takatsuki (JP); Hiroshi Ando, Ibaraki (JP); Jinsaku Kaneda, Suita (JP); Akihiro Maejima, Takatsuki (JP); Hiroki Matsunaga, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 19 days.

(21) Appl. No.: 11/211,638

(22) Filed: Aug. 26, 2005

(65) Prior Publication Data

US 2006/0044041 A1  Mar. 2, 2006

(30) Foreign Application Priority Data

Aug. 30, 2004 (JP) ............... 2004-249733
Aug. 18, 2005 (JP) ............... 2005-237952

(51) Int. Cl.
*H03L 5/00* (2006.01)

(52) U.S. Cl. .................. 327/333; 326/68; 326/81

(58) Field of Classification Search ............... 327/333; 326/63, 68, 80; 32/81
See application file for complete search history.

(56) References Cited

U.S. PATENT DOCUMENTS

| | | | | |
|---|---|---|---|---|
| 4,973,864 A | * | 11/1990 | Nogami | 327/55 |
| 5,243,236 A | * | 9/1993 | McDaniel | 326/68 |
| 6,633,285 B1 | | 10/2003 | Kigo et al. | |
| 2004/0070577 A1 | | 4/2004 | Kigo et al. | |
| 2004/0125095 A1 | | 7/2004 | Kigo et al. | |
| 2004/0125096 A1 | | 7/2004 | Kigo et al. | |

FOREIGN PATENT DOCUMENTS

| | | |
|---|---|---|
| JP | 1-253309 | 10/1989 |
| JP | 6-091442 | 11/1994 |
| JP | 2000-164730 | 6/2000 |
| JP | 2000164730 A * | 6/2000 |

OTHER PUBLICATIONS

English Language Abstract of JP 1-253309, Oct. 9, 1989.
English Language Abstract of JP 2000-164730, Jun. 16, 2000.

* cited by examiner

*Primary Examiner*—Quan Tra
(74) *Attorney, Agent, or Firm*—Greenblum & Bernstein, P.L.C.

(57) ABSTRACT

A driver circuit is provided for preventing generation of a pass-through current in a CMOS output unit even if a power supply voltage VDD supplied from a low voltage power supply drops below a recommended operating power supply voltage. The driver circuit includes a level shift unit having PMOS transistors and NMOS transistors, and a CMOS output unit having a PMOS transistor and an NMOS transistor. The source, drain and gate of one PMOS transistor are respectively connected to a high voltage power supply, a first contact and a second contact. The source, drain and gate of a second PMOS transistor are respectively connected to a high voltage power supply, the second contact and the first contact. The source of one NMOS transistor is grounded, the drain thereof is connected to the first contact, and the gate thereof receives a low voltage signal. The source of a second NMOS transistor is grounded, the drain thereof is connected to the second contact, and the gate thereof receives a low voltage signal. In this driver circuit, the driving current of the one PMOS transistor is higher than the driving current of the one NMOS transistor.

13 Claims, 15 Drawing Sheets

DRIVER CIRCUIT

BACKGROUND OF THE INVENTION (1) Field of the Invention

The present invention relates to a driver circuit for driving a plasma display panel (PDP) or the like.

(2) Description of the Related Art

As shown in FIG. 1, a conventional PDP driver includes a level shift unit 25, a CMOS output unit 26 and a low voltage control unit 21.

The level shift unit 25 includes a PMOS transistor 17 and a PMOS transistor 16. The sources of the transistors 17 and 16 are both connected to a high voltage power supply terminal 22, the drains thereof are respectively connected to a contact IN5 and a contact IN4, and the gate of one transistor is connected to the drain of the other transistor crosswise. The level shift unit 25 further includes an NMOS transistor 20 and an NMOS transistor 19. The gates of these transistors 20 and 19 are respectively connected to one of a contact IN1 and IN2 of the low voltage control unit 21, the drains thereof are respectively connected to the contact IN5 and the contact IN4, and the sources thereof are both grounded.

The CMOS output unit 26 includes an NMOS transistor 18 and a PMOS transistor 15. The gate of the NMOS transistor 18 is connected to a contact IN3 of the low voltage control unit 21, the drain thereof is connected to an output terminal 24, and the source thereof is grounded, while the source of the PMOS transistor is connected to the high voltage power supply terminal 22, the gate thereof is connected to the contact IN4, and the drain thereof is connected to the output terminal 24.

The low voltage control unit 21 is connected to a low voltage power supply terminal 27. An output load 34 is a capacitive load like a plasma display panel.

FIG. 2 shows the waveforms of the input and output signals of the low voltage control unit 21 in the conventional PDP driver and the signals at the contacts IN4, IN5 and the output terminal 24.

Next, the operation of the conventional PDP driver is described below. It is assumed here that the signal IN inputted to the low voltage control unit 21 switches from High (VDD level in this case) to Low (GND level in this case). In this case, the NMOS transistor 20 is turned on by the signal IN1 inputted from the low voltage control unit 21 and the potential of the contact IN5 drops to the ground potential (GND), which turns on the PMOS transistor 16. At the same time as the turn-on of the PMOS transistor 16, the NMOS transistor 16 is turned off by the signal IN2 inputted from the low voltage control unit 21, and as a result, the potential of the contact IN4 rises to the potential level of the high voltage power supply (VDDH), which turns off the PMOS transistor 15. Furthermore, the NMOS transistor 18 is turned on by the signal IN3 inputted from the low voltage control unit 21, which causes the potential of the output terminal 24 to drop to the ground potential (GND).

Reversely, when the IN signal switches from High to Low, the NMOS transistor 19 is turned on by the signal IN2 inputted from the low voltage control unit 21. At the same time as the turn-on of the NMOS transistor 19, the NMOS transistor 20 is turned off, the PMOS transistor 17 is turned on and the PMOS transistor 16 is turned off by the signal IN1. At that time, the potential of the contact IN4 drops to the ground potential (GND), which turns on the PMOS transistor 15. As a result, the potential of the output terminal 24 rises to the potential level of the high voltage power supply (VDDH), and the NMOS transistor 18 is turned off by the signal IN3.

In this case, the driving capability of each transistor in the level shift unit 25 is determined as follows.

The PMOS transistor 16 and the NMOS transistor 19 of which drains are connected to the CMOS output unit 26 have heavier driving load than the PMOS transistor 17 and the NMOS transistor 20 which are placed at the front side in the level shift unit 25 because the PMOS transistor 16 and the NMOS transistor 19 drive the CMOS output unit 26. Therefore, the PMOS transistor 16 and the NMOS transistor 19 need to have higher driving capability than the PMOS transistor 17 and the NMOS transistor 20 (See Examined Japanese Patent Application Publication No. 6-91442).

When the potentials of IN4 and IN5 in the level shift unit 25 switch from High (VDDH level in this case) to Low (GND level in this case) and vice versa, namely from Low to High, pass-through current flows transiently through the PMOS transistor 17 and the NMOS transistor 20 and through the PMOS transistor 16 and the NMOS transistor 19, respectively. In order to reduce this pass-through current, the potentials of IN4 and IN5 must be immediately switched to the potentials of stable values. Therefore, the NMOS transistors 20 and 19 need to have higher driving capabilities than the PMOS transistors 17 and 16 (See Laid-Open Patent Application Publication No. 2000-164730).

As described above, in the conventional PDP driver, the pass-through current hardly flows through the level shift unit 25 and the CMOS output unit 26 if the power supply voltage VDD supplied from the low voltage power supply to the low voltage power supply terminal 27 is within a range of recommended operating power supply voltages, that is, within a range of power supply voltages which ensure the normal operation of the circuit, and therefore the desired operation is achieved.

However, the power supply voltage VDD supplied from the low voltage power supply to the low voltage power supply terminal 27 may be maintained around the medium potential VLo that is lower than the rated value because the low voltage power supply is not started up or shut down immediately when the power is turned on or off. For example, in the case where the rated value of the power supply voltage VDD is 5V, when the power is turned on, the power supply voltage VDD supplied from the low voltage power supply to the low voltage power supply terminal 27 is sometimes maintained around the medium potential VLo of 2V during the transition in which the voltage VDD is turned off. In this case where the power supply voltage VDD which has been supplied from the low voltage power supply to the low voltage power supply terminal 27 becomes lower than the recommended operating power supply voltage and the High levels of IN1, IN2 and IN3 drop, the circuit operates differently from the above-mentioned desired operation.

As shown in FIG. 3, when an input voltage IN switches from High (VLo level in this case) to Low (GND level in this case), the input voltage IN1 of the level shift unit 25 turns into High, so that the NMOS transistor 20 is turned on and the PMOS transistor 16 is turned on. On the contrary, the input voltage IN2 of the level shift unit 25 turns into Low, so that the NMOS transistor 19 is turned off and the PMOS transistor 17 is turned off. If the power supply voltage VDD drops, it becomes impossible to secure the input voltage IN1 that is sufficiently larger than the threshold voltage (VT) of the NMOS transistor 20. Therefore, the potential of the contact IN5 cannot switch to Low instantaneously and there is a period of time t0 during which the potential of the contact IN5 stays at the medium potential 1 (VDDL level in this case).

On the other hand, the driving capability of the PMOS transistor 16 is lower than that of the NMOS transistor 19. In addition, since the potential of the contact IN5 is not Low but stays at the medium potential 1 (VDDL level) during the period t0, the PMOS transistor 16 is in an incomplete ON state and thus its driving current is reduced. Therefore, the PMOS transistor 16 which is in the incomplete ON state cannot supply the current sufficiently larger than the current driven by the NMOS transistor 19 which is in an incomplete OFF state, and thus the PMOS transistor 16 cannot be turned on instantaneously. As a result, the potential of the contact IN4 does not rise from Low (GND level in this case) to High (VDDH level in this case) immediately and there is a period of time t0 during which it stays at the medium potential 2 (VDDM level in this case).

During this period t0, the PMOS transistor 15 of the CMOS output unit 26 cannot be turned off completely due to the potential at the contact IN4, and the NMOS transistor 18 of the CMOS output unit 26 is in an ON state by the input signal from IN3. As a result, both the PMOS transistor 15 and the NMOS transistor 18 of the CMOS output unit 26 are turned on, and therefore the potential of the output terminal 24 does not drop completely to the ground potential but stays at the medium potential (VoutM level in this case). Therefore, a large amount of pass-through current flows from the high voltage power supply (VDDH) side to the ground potential (GND) side of the CMOS output unit 26. This pass-through current causes a breakdown of the PDP driver and the image deterioration of the plasma display panel.

This problem is very serious particularly when the power supplied to the PDP driver is turned off. As shown in FIG. 4, after the power is turned off, the voltage of the low voltage power supply VDD declines with a small time constant (namely, fast), while the voltage of the high voltage power supply VDDH declines with a large time constant (namely, slowly), according to the amount of load put on the high voltage power supply VDDH and the low voltage power supply VDD, respectively. Therefore, the gate voltage of the NMOS transistor 20 declines fast while the high voltage is being supplied from the high voltage power supply VDDH to the CMOS output unit 26, and the PMOS transistor 15 is not turned off completely, which results in a flow of pass-through current in the CMOS output unit 26.

SUMMARY OF THE INVENTION

The present invention has been conceived in view of the above problem, and an object of the present invention is to provide a driver circuit for preventing the flow of pass-through current through the CMOS output unit even if the power supply voltage supplied from the low voltage power supply becomes lower than the recommended operating power supply voltage.

In order to solve the above problem and achieve the above object, the driver circuit according to the present invention includes: (a) a level shift unit including a first P-channel metal-oxide semiconductor (PMOS) transistor, a second PMOS transistor, a first N-channel metal-oxide semiconductor (NMOS) transistor and a second NMOS transistor, wherein a source, a drain and a gate of the first PMOS transistor are respectively connected to a high voltage power supply, a first contact and a second contact, a source, a drain and a gate of the second PMOS transistor are respectively connected to the high voltage power supply, the second contact and the first contact, a source of the first NMOS transistor is grounded, a drain of the first NMOS transistor is connected to the first contact, and a gate of the first NMOS transistor receives a first signal, and a source of the second NMOS transistor is grounded, a drain of the second NMOS transistor is connected to the second contact, and a gate of the second NMOS transistor receives a second signal; (b) a low voltage control unit, which is connected to a low voltage power supply, operable to output, according to an input signal, the first signal to the gate of the first NMOS transistor and the second signal to the gate of the second NMOS transistor; and (c) a push-pull output unit operable to perform a switching operation based on a signal at the first contact of the level shift unit and a third signal outputted from the low voltage control unit, wherein a driving current of the first PMOS transistor is higher than a driving current of the first NMOS transistor.

As described above, in the driver circuit according to the present invention, the driving current of the first PMOS transistor is larger than the driving current of the first NMOS transistor. Therefore, it is possible to prevent the generation of pass-through current in the CMOS output unit even if the power supply voltage VDD becomes lower than the recommended operating power supply voltage.

It should be noted that the driving current of a MOS transistor is a drain current that flows when the MOS transistor is on. As specific methods for determining the value of this driving current, there are a method for designing a MOS transistor so that the driving capability (mutual conductance) of the MOS transistor itself becomes an appropriate value, a method for connecting a resistive element that limits the drain current flow through the MOS transistor, as a load on the MOS transistor, and the like.

The above-mentioned push-pull output unit is a transistor output circuit in which two transistors are connected in series between the power supply and the ground, and also refers to a totem-pole circuit, a CMOS circuit or the like.

As described above, it becomes possible, according to the present invention, to provide a driver circuit for preventing the generation of pass-through current in the CMOS output unit even if the power supply voltage becomes lower than the recommended operating power supply voltage.

Particularly, since the pass-through current does not flow through the CMOS output unit in the case where the driver circuit of the present invention is applied to a PDP driver, so it becomes possible to prevent the breakdown of the PDP driver and image deterioration of the plasma display. Therefore, the reliability of the PDP driver and the plasma display can be improved.

As further information about technical background to this application, the disclosures of Japanese Patent Application No. 2004-249733 filed on Aug. 30, 2004 and Japanese Patent Application No. 2005-237952 filed on Aug. 18, 2005, including specifications, drawings and claims, are incorporated herein by reference in their entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The best mode for carrying out the present invention is described below with reference to the diagrams.

First Embodiment

First, a structure of a PDP driver in the first embodiment is described with reference to FIG. 5.

Figure 5:
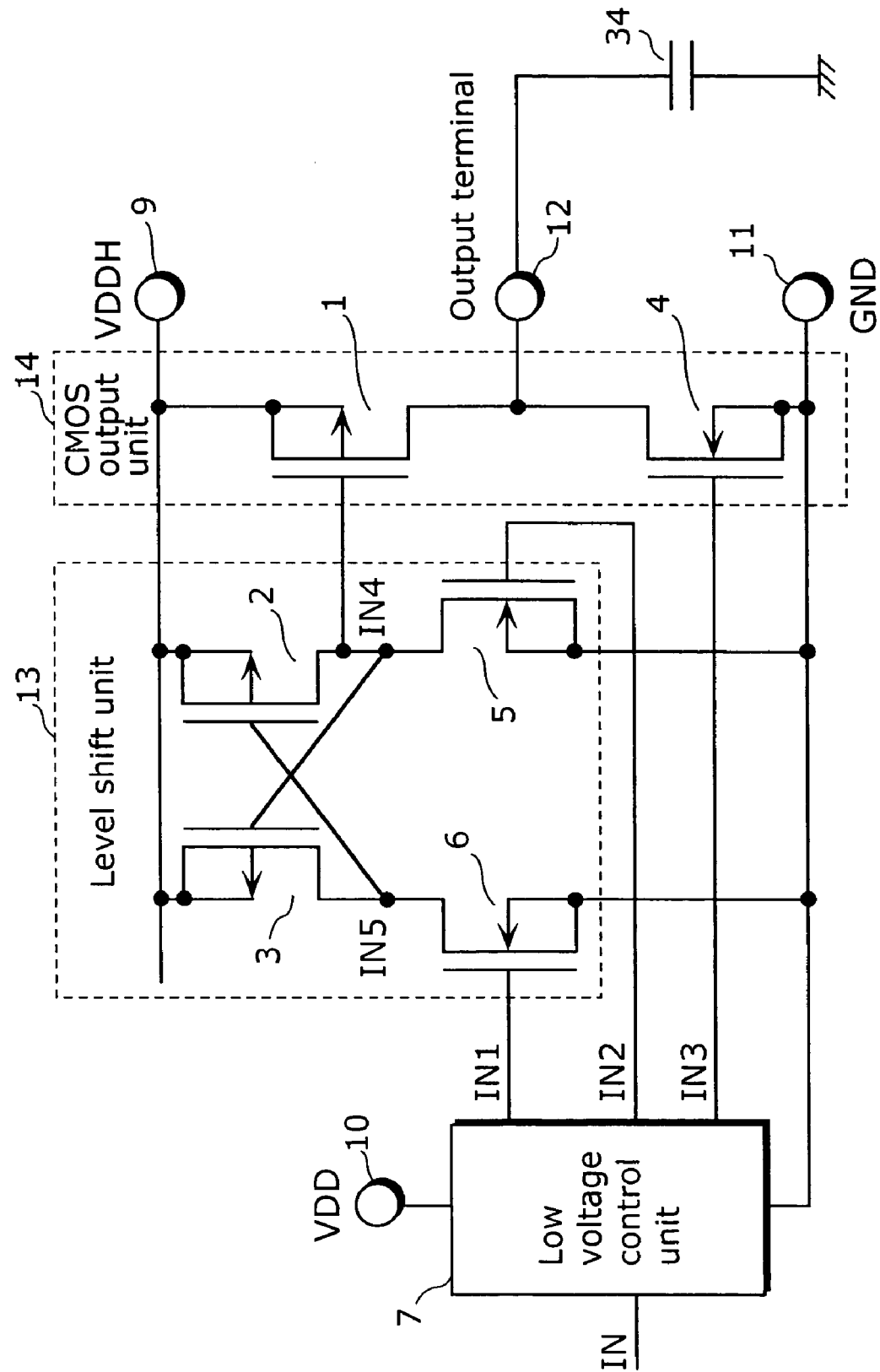
FIG. 5 is a structure diagram of a PDP driver in a first embodiment of the present invention.

FIG. 5 is a structure diagram of the PDP driver in the first embodiment. The PDP driver in the first embodiment, which is one example of the driver circuit of the present invention, includes a level shift unit 13, a CMOS output unit 14, and a low voltage control unit 7.

The level shift unit 13 includes a PMOS transistor 3 and a PMOS transistor 2. The sources of these transistors 3 and 2 are both connected to a high voltage power supply terminal 9, the drains thereof are respectively connected to the contact IN5 and the contact IN4, and the gate of one transistor is connected to the drain of the other transistor crosswise. The level shift unit 13 further includes an NMOS transistor 6 and an NMOS transistor 5. The gates of these transistors 6 and 5 are respectively connected to one of the contact IN1 or IN2 of the low voltage control unit 7, the drains thereof are respectively connected to the contact IN5 and the contact IN4, and the sources thereof are both grounded.

The CMOS output unit 14 is one example of a push-pull output unit which performs switching operations based on the signal at the contact IN4 of the level shift unit 13 and the signal IN3 outputted from the low voltage control unit 7. The CMOS output unit 14 includes an NMOS transistor 4 and a PMOS transistor 1. The gate of the NMOS transistor 4 is connected to the contact IN3 of the low voltage control unit 7, the drain thereof is connected to the output terminal 12, and the source thereof is connected to the ground potential terminal 11. The source of the PMOS transistor 1 is connected to the high voltage power supply terminal 9, the gate thereof is connected to the contact IN4, and the drain thereof is connected to the output terminal 12.

The low voltage control unit 7 is connected to the low voltage power supply terminal 10. The output load 34 indicates a capacitive load like a plasma display panel.

Figure 6:
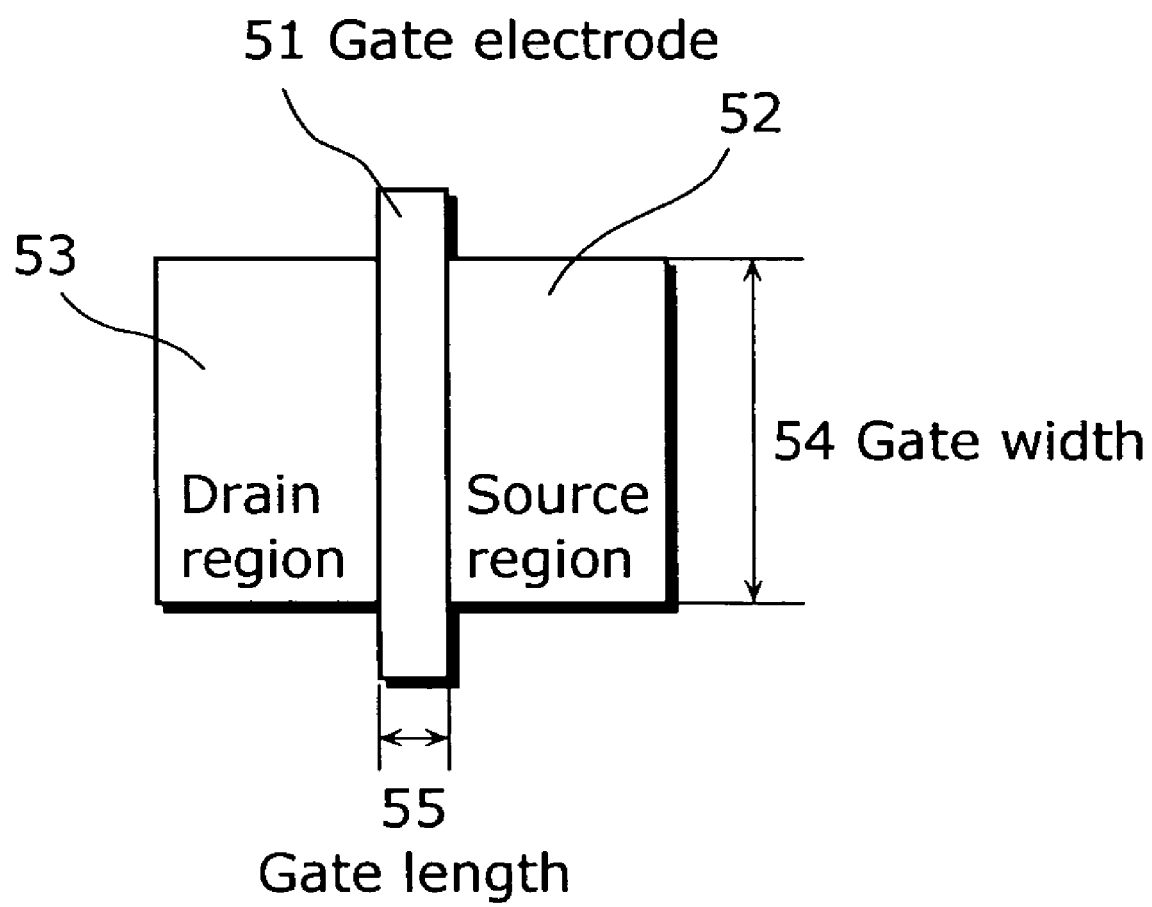
FIG. 6 is a plan view showing a structure of a MOS transistor.

Here, the driving capabilities of the PMOS transistor 2, the PMOS transistor 3, the NMOS transistor 5 and the NMOS transistor 6 in the level shift unit 13 are set in the following order. To be more specific, the driving capabilities of the PMOS transistor 3, the NMOS transistor 6, the NMOS transistor 5 and the PMOS transistor 2 increase, in that order from lowest to highest. The driving capability of a transistor is determined by the length of the side of a source region 52 facing a drain region 53, that is, the length of a gate width 54, as shown in the plan view of the structure of a MOS transistor in FIG. 6. For example, by setting the gate width of each transistor in the level shift unit 13 in the above order of the PMOS transistor 3 narrowest, the NMOS transistor 6, the NMOS transistor 5 and the PMOS transistor 2 widest, the driving capabilities are set in the above order. It should be noted that a driving capability denotes a mutual conductance of a transistor, $gm=ID/VGS$, that is the property indicating an amount of current ID relative to the input voltage VGS between the gate and source. The driving capability can also be changed by changing the gate length 55 shown in FIG. 6.

Next, the operation of the PDP driver in the first embodiment is described with reference to FIG. 7.

Since the operation of the PDP driver in the present embodiment is same as that of the conventional PDP driver in the case where the power supply voltage VDD supplied from the low voltage power supply is within a range of recommended operating power supply voltages, the description thereof is not repeated here. A description is given below of the operation of the PDP driver in the present embodiment in the case where the power supply voltage VDD becomes VLo that is lower than the recommended operating power supply voltage because the low voltage power supply is not started up or shut down immediately when the power supply is turned on or off.

Figure 7:
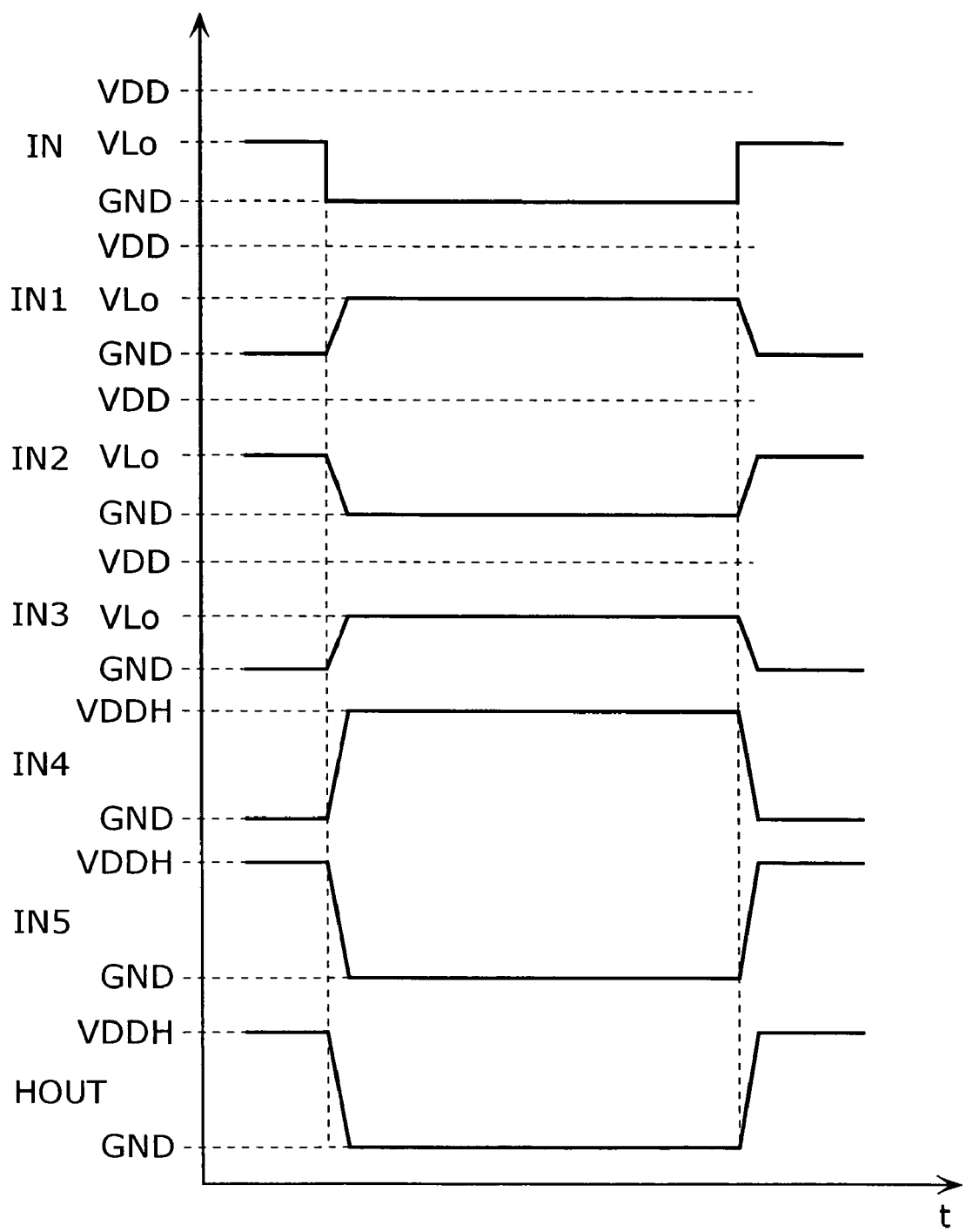
FIG. 7 is a diagram showing input and output signals obtained when a power supply voltage to be supplied to the PDP driver in the first embodiment drops.

FIG. 7 is a diagram showing the waveforms of the input and output signals at the low voltage control unit 7 and the signals at the contacts IN4 and IN5 and the output terminal 12 in the case where the power supply voltage VDD becomes VLo that is lower than the recommended operating power supply voltage.

Figure 1:
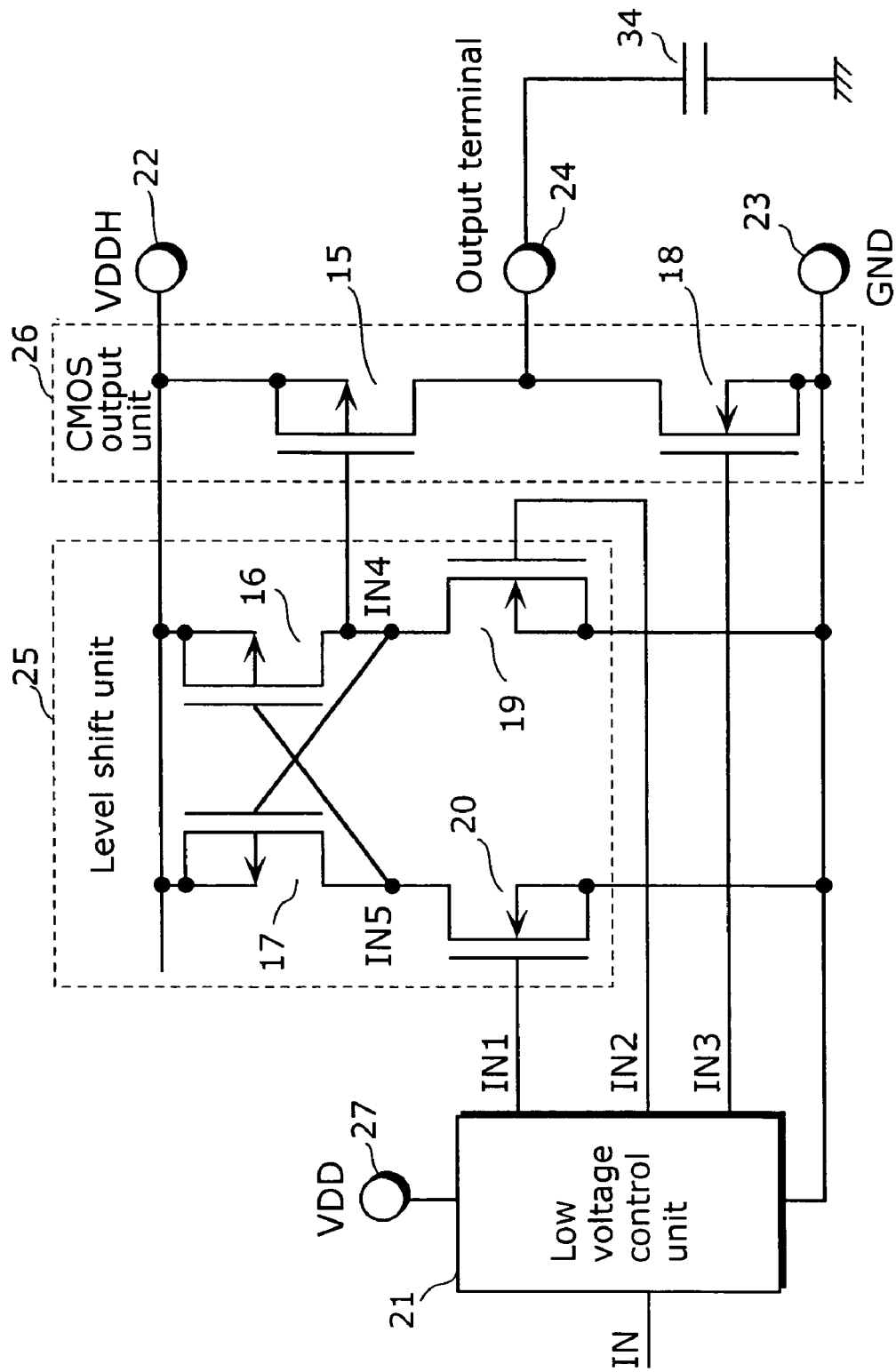
FIG. 1 is a structure diagram of a conventional PDP driver.
Figure 2:
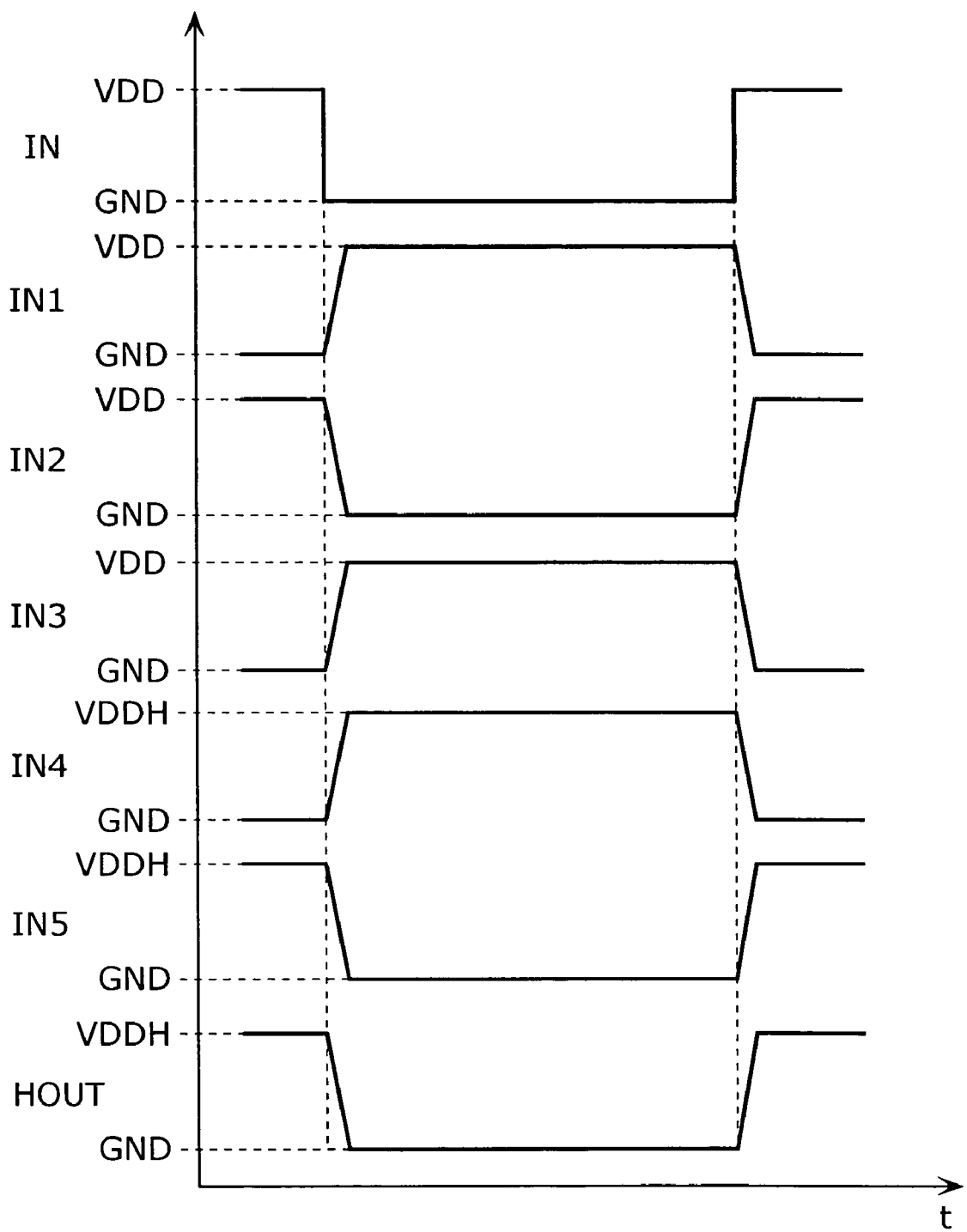
FIG. 2 is a diagram showing input and output signals of the conventional PDP driver.
Figure 3:
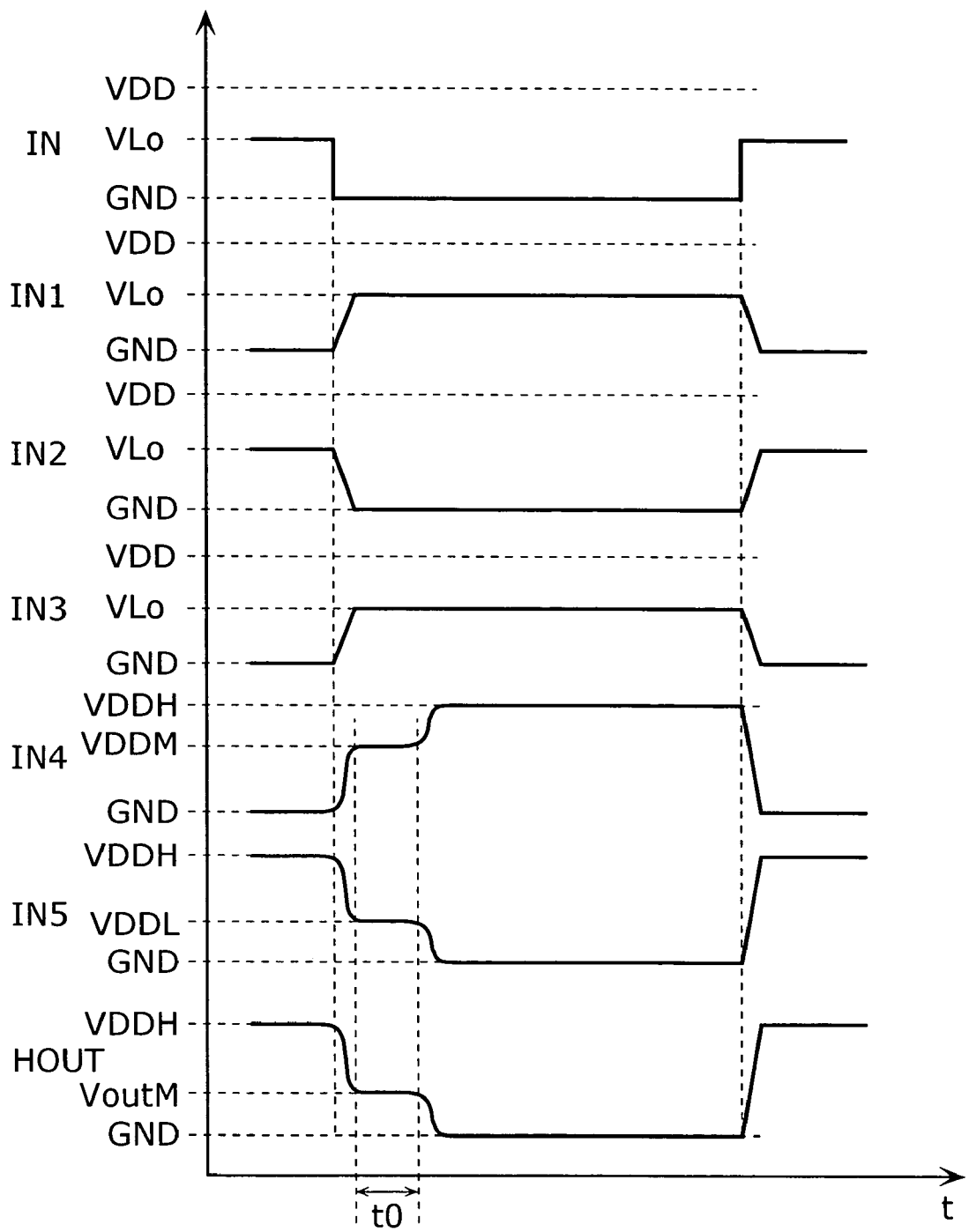
FIG. 3 is a diagram showing input and output signals obtained when a power supply voltage to be supplied to the conventional PDP driver drops.
Figure 4:
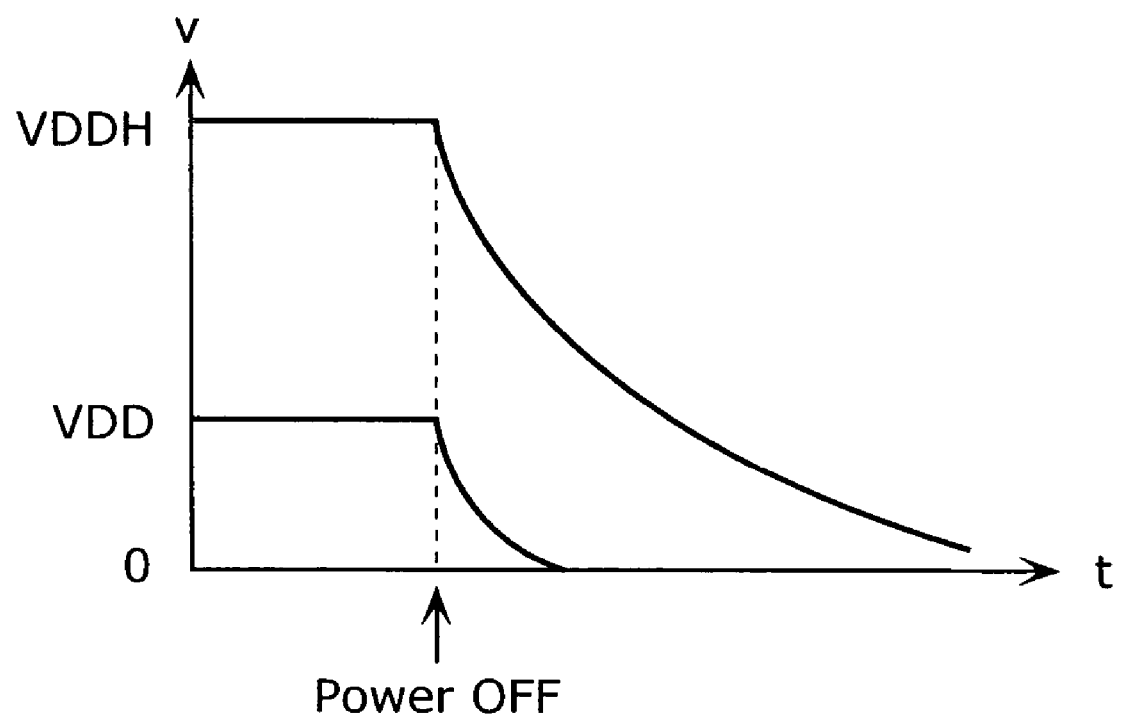
FIG. 4 is a diagram showing changes in output voltages of the high voltage power supply and the low voltage power supply in the case where the power supply to the PDP driver is turned off.

When the input voltage IN switches from High (VLo level in this case) to Low (GND level in this case), the signal IN1 outputted from the low voltage control unit 7 is switched to High, so that the NMOS transistor 6 is turned on and the PMOS transistor 3 is turned off. On the other hand, the signal IN2 outputted from the low voltage control unit 7 is switched to Low, so that the NMOS transistor 5 is turned off and the PMOS transistor 2 is turned on. At this time, the driving capability of the NMOS transistor 6 is higher than the driving capability of the PMOS transistor 3, but sufficient threshold voltage (VT) cannot be secured at the NMOS transistor 6 because the input voltage of IN1 has dropped. Therefore, if the driving capability of the PMOS transistor 2 is lower than the driving capability of the NMOS transistor 5 as is the case of the conventional driver, the potential of the contact IN5 is not changed to Low instantaneously but is maintained at the medium potential 1 as shown in FIG. 3 (VDDL level in this case).

However, in the first embodiment, the driving capability of the PMOS transistor 2 is higher than that of the NMOS transistor 5. Therefore, even if the potential at the contact IN5 is maintained at the medium potential 1 and the PMOS transistor 2 is in an incomplete ON state, the PMOS transistor 2 can supply the current sufficiently larger than the current driven by the NMOS transistor 5 which is in an incomplete OFF state, and thus the PMOS transistor 2 can be turned on instantaneously. As a result, the potential at the contact IN4 rises to High (VDDH level in this case) immediately, so that the PMOS transistor 3 is turned off and the potential at the contact IN4 changes to Low (GND level in this case) immediately. Therefore, there is no period of time t0 during which the potential stays at the medium potential 1 or 2 as shown in FIG. 3.

Accordingly, when IN switches from High to Low, the potential at the contact IN4 switches to High (VDDH level) instantaneously, and therefore the PMOS transistor 1 in the CMOS output unit 14 is completely turned off instantaneously. Also, the NMOS transistor 4 in the CMOS output unit 14 is turned on according to the signal inputted from IN3, and therefore the potential at the output terminal 12 completely drops to ground potential (GND). As a result, no pass-through current flows through the CMOS output unit 14.

Accordingly, it becomes possible to prevent the breakdown of the PDP driver and the image deterioration of the plasma display panel (output load 34) and thus improve the reliability of the PDP driver and the plasma display panel.

As described above, the driving capabilities of respective transistors in the level shift unit 13, that is, the PMOS transistor 3, the NMOS transistor 6, the NMOS transistor 5 and the PMOS transistor 2, increase in that order from lowest to highest. Therefore, even if the power supply voltage VDD drops to VLo that is lower than the recommended operating power supply voltage, each transistor in the level shift unit 13 and the CMOS output unit 14 is switched from ON to OFF or from OFF to ON instantaneously upon switching of the input voltage IN from High to Low. In other words, both the PMOS transistor 1 and the NMOS transistor 4 are never switched on at the same time in the CMOS output unit 14. As a result, no pass-through current flows through the CMOS output unit 14, and therefore it becomes possible to prevent the breakdown of the PDP driver and the image deterioration of the plasma display panel (output load 34).

It should be noted that the case where the input voltage IN is switched from High to Low has been described in the above first embodiment. The same is true in the case where IN is switched from Low to High. Since the driving capability of each transistor in the level shift unit 13 is also set as mentioned above in this case, each transistor is switched from ON to OFF or from OFF to ON instantaneously even if the voltage from the low voltage power supply drops to VLo. Therefore, no pass-through current flows through the CMOS output unit 14, and therefore it becomes possible to prevent the breakdown of the PDP driver and the image deterioration of the plasma display panel (output load 34).

Second Embodiment

A structure of a PDP driver in the second embodiment is described with reference to FIG. 8.

Figure 8:
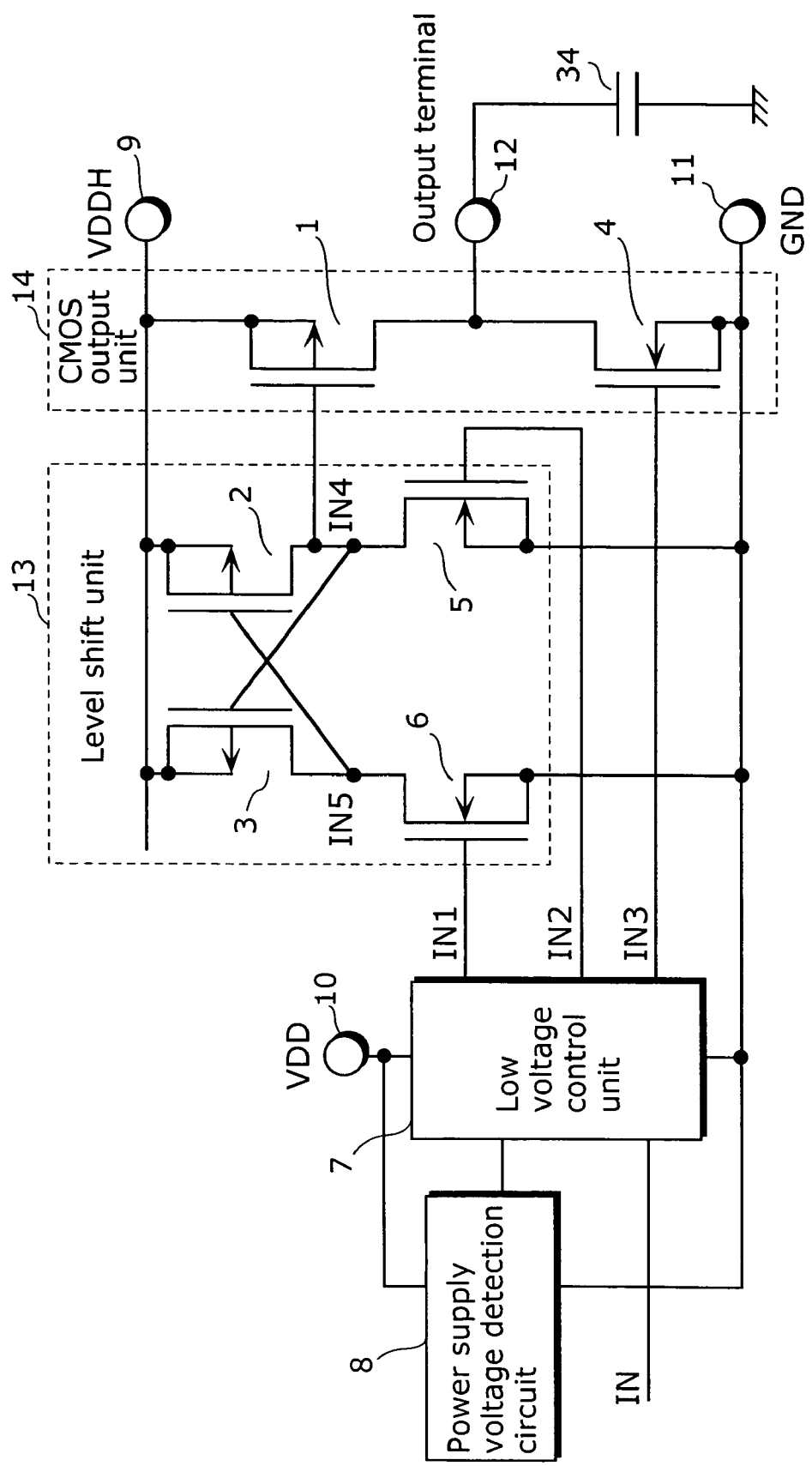
FIG. 8 is a structure diagram of a PDP driver in a second embodiment.

FIG. 8 is a structure diagram of the PDP driver in the second embodiment. The PDP driver in the second embodiment has the same structure as the PDP driver in the first embodiment except that the former includes a power supply voltage detection circuit 8.

Figure 9:
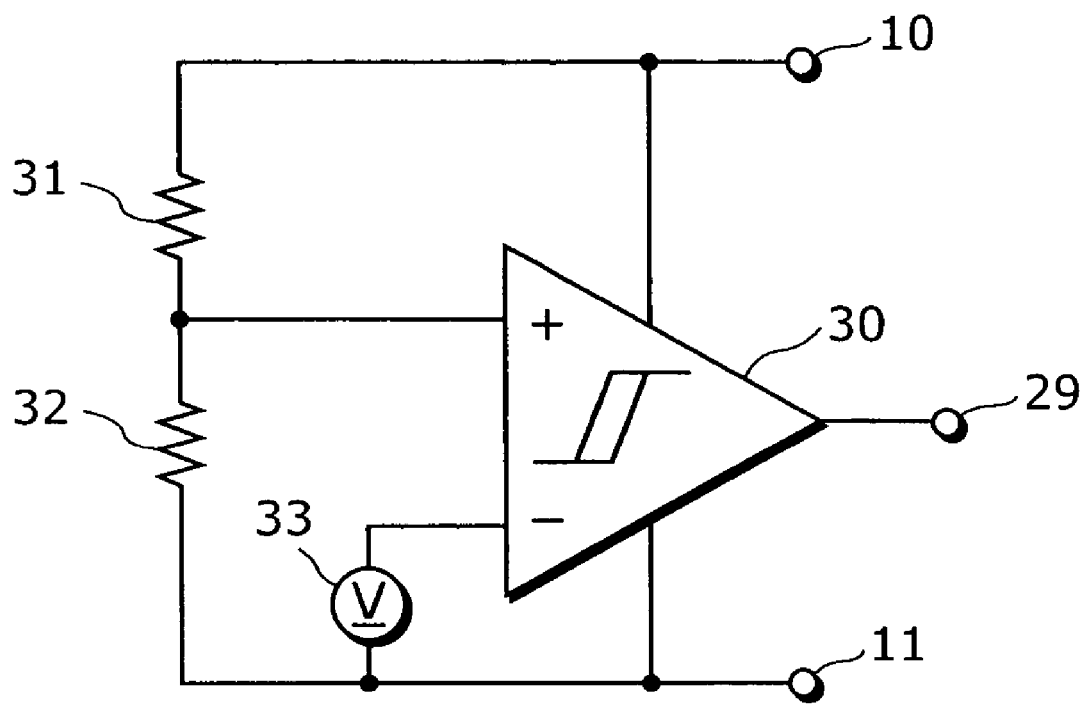
FIG. 9 is a diagram showing a structure of a power supply voltage detection circuit.

The power supply voltage detection circuit 8 is connected to the low voltage power supply terminal 10 and the low voltage control unit 7. FIG. 9 shows the details of the power supply voltage detection circuit 8. The power supply voltage detection circuit 8 compares, using a hysteresis converter 30, a voltage of a reference voltage source 33 with a voltage obtained by dividing a voltage of the low voltage power supply terminal 10 using a resistor 31 and a resistor 32. The power supply voltage detection circuit 8 outputs a control signal to the output terminal 29 based on the comparison result obtained from the hysteresis converter 30.

Figure 10:
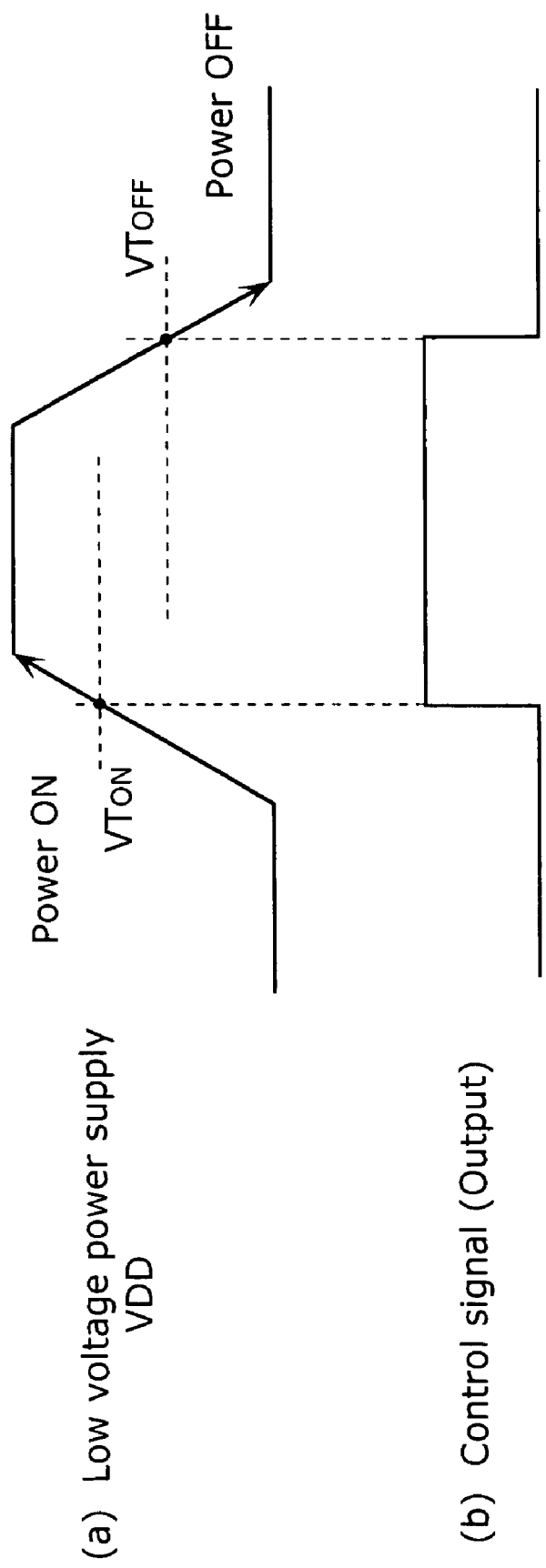
FIG. 10 is a timing chart showing the operation of the power supply voltage detection circuit.

FIG. 10 is a timing chart showing the operation of the power supply voltage detection circuit 8. The power supply voltage detection circuit 8 outputs a control signal which changes from Low to High and from High to Low according to the change in the power supply voltage VDD of the low voltage power supply terminal 10. To be more specific, the control signal stays at Low level during a period in which the power supply voltage VDD changes from the ground voltage to a predetermined potential (VTON potential), and switches to High level when the power supply voltage VDD exceeds the VTON potential because it continues to rise. The control signal stays at High level during a period in which the power supply voltage VDD reaches and stays at the rated value and then begins to drop from the rated value below the VTON potential, and switches to Low level when the power supply voltage VDD drops to the VTOFF potential that is lower than VTON potential.

Figure 11:
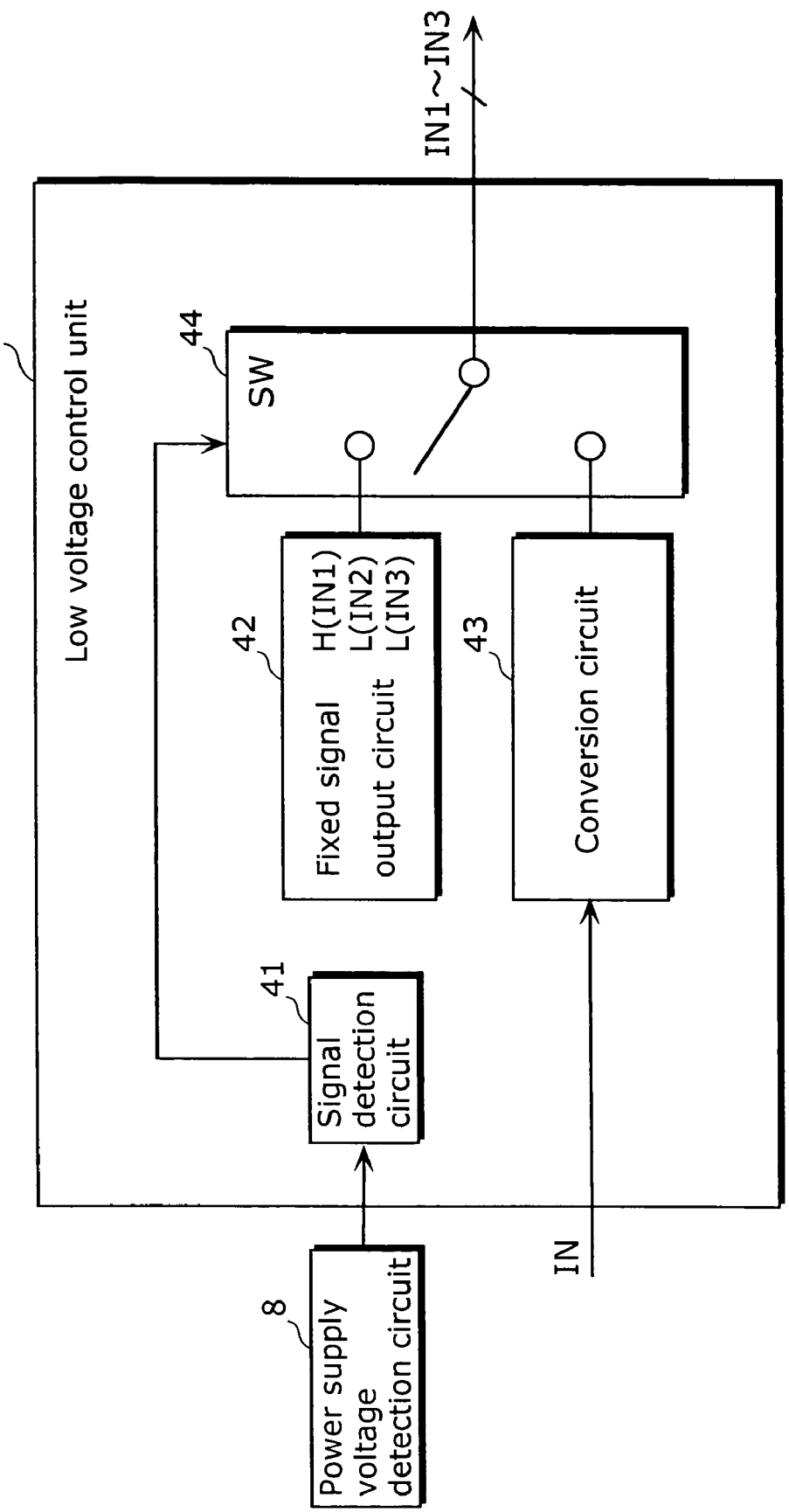
FIG. 11 is a diagram showing a structure of a low voltage control unit.

FIG. 11 is a structure diagram of the low voltage control unit 7. In the low voltage control unit 7, a switch (SW) 44 selects a conversion circuit 43 when the control signal which is inputted to a signal detection circuit 41 from the power supply voltage detection circuit 8 turns into High level. The conversion circuit 43 converts an input signal IN as is the case with the first embodiment. The signals IN1, IN2 and IN3 from the conversion circuit 43 are outputted to the gates of the NMOS transistor 6, the NMOS transistor 5 and the NMOS transistor 4, which results in the same operations as those in the first embodiment.

On the other hand, when the voltage from the low voltage power supply drops and the control signal which is inputted to the signal detection circuit 41 from the power supply voltage detection circuit 8 turns into Low level, the switch (SW) 44 selects a fixed signal output circuit 42. The fixed signal output circuit 42 outputs the signal IN1 of High level (VDD level, for example), the signal IN2 of Low level (GND level) and the signal IN3 of Low level (GND level), regardless of the input signal IN.

When the signal IN1 turns into High level, the NMOS transistor 6 is turned on and the potential at the contact IN5 drops to the ground potential (GND), and thus the PMOS transistor 2 is turned on. As a result, the potential at the contact IN4 is raised to the potential at the high voltage power supply (VDDH) and the PMOS transistor 1 is turned off. According to the signal IN3 of Low level, the NMOS transistor 4 is turned off. The NMOS transistor 5 is also turned off according to the signal IN2 of Low level. As a result, the PMOS transistor 1 and the NMOS transistor 4 are turned off, and therefore no pass-through current is generated in the CMOS output unit 14.

The threshold voltage (VT) of a MOS transistor may fluctuate due to variations in manufacturing processes. In such a case, if the voltage at the low voltage power supply terminal 10 significantly drops, it becomes impossible to meet the prerequisite that the driving capability of the PMOS transistor 2 is higher than that of the NMOS transistor 5. Therefore, the PMOS transistor 2 cannot supply the current sufficiently larger than the current driven by the NMOS transistor 5.

However, if the voltage at the low voltage power supply terminal 10 significantly drops, the power supply voltage detection circuit 8 outputs the control signal of Low level, while the low voltage control unit 7 outputs the signal IN1 of High level, the signal IN2 of Low level and the signal IN3 of Low level. Therefore, as described above, the PMOS transistor 1 and the NMOS transistor 4 are turned off. As a result, it becomes possible to prevent the generation of the pass-through current in the CMOS output unit 14 even if the PMOS transistor 2 cannot supply the current sufficiently larger than the current driven by the NMOS transistor 5, as described above.

It should be noted that the PDP driver in the second embodiment not only includes the power supply voltage detection circuit 8 in addition to the elements of the PDP driver in the first embodiment, but also includes the low voltage control unit 7 which outputs the signal IN1 of High level, the signal IN2 of Low level and the signal IN3 of Low level when the power supply voltage detection circuit 8 outputs the control signal of High level. However, the power supply voltage detection circuit 8 may be provided not only in the PDP driver in the first embodiment but also in the conventional PDP driver. In this case, the low voltage control unit 21 is designed in advance so as to output the signal IN1 of High level, the signal IN2 of Low level and the signal IN3 of Low level when the control signal of High level is inputted from the power supply voltage detection circuit 8. By doing so, it becomes possible to prevent the generation of the pass-through current in the CMOS output unit 26 by the operations of the power supply voltage detection circuit 8 and the low voltage control unit 21, irrespective of the relationship of the driving capabilities of the NMOS transistor 19, the NMOS transistor 20, the PMOS transistor 16 and the PMOS transistor 17 in the level shift unit 25, even if the power supply voltage VDD drops below the recommended operating power supply voltage. As a result, it becomes possible to easily design the driving capabilities of respective PMOS and NMOS transistors in the level shift units 13 and 25.

Third Embodiment

A structure of a PDP driver in the third embodiment is described with reference to FIG. 12.

Figure 12:
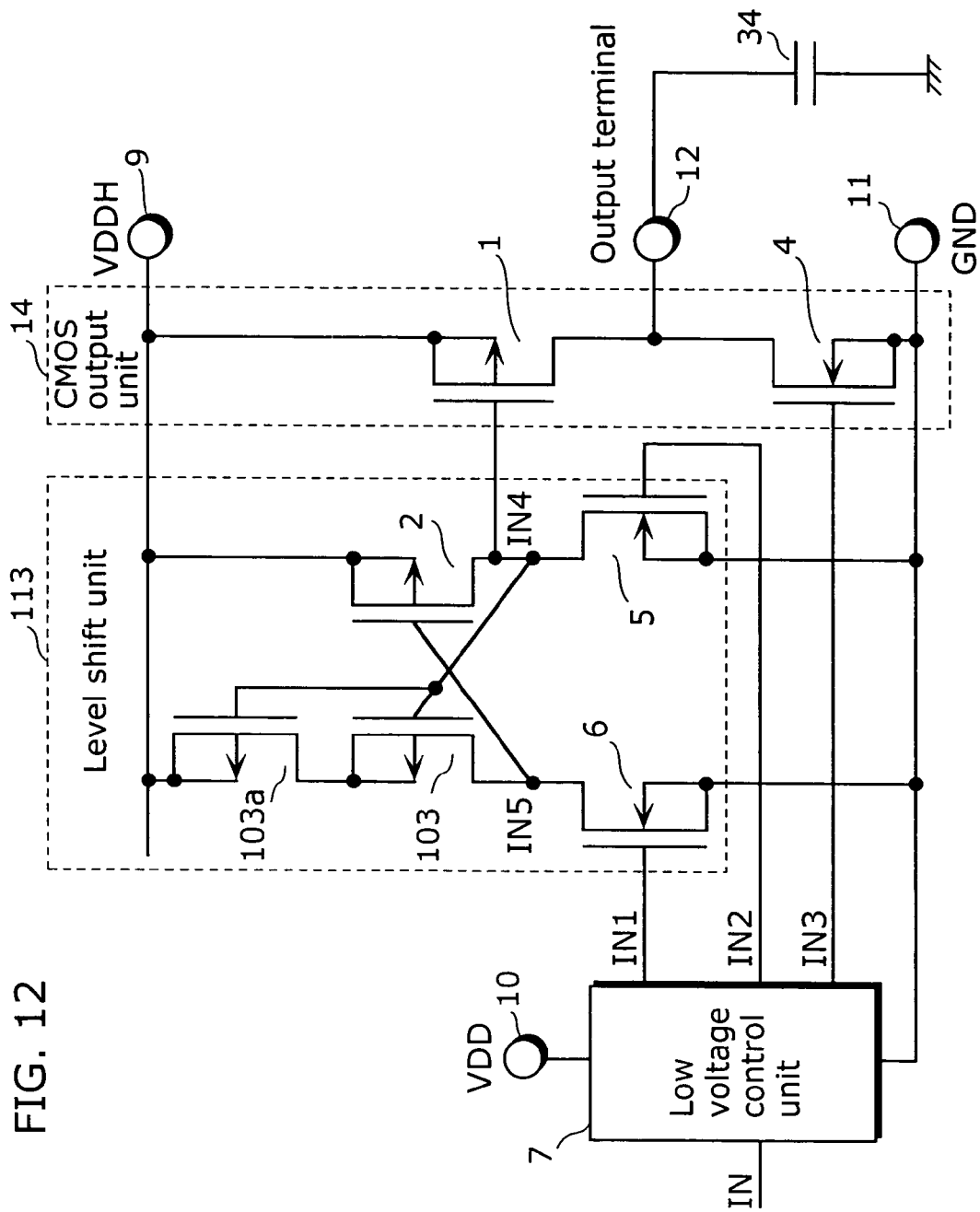
FIG. 12 is a structure diagram of a PDP driver in a third embodiment.

FIG. 12 is a structure diagram of the PDP driver in the third embodiment. The PDP driver in the third embodiment has the same structure as the PDP driver in the first embodiment except for a level shift unit 113.

The level shift unit 113 of the present embodiment corresponds to the circuit in which the PMOS transistor 3 in the level shift unit 13 of the first embodiment is substituted by a PMOS transistor 103 and a PMOS transistor 103*a* which are connected in series.

The PMOS transistor 103 is, for example, a PMOS transistor having the driving capability equivalent to that of the NMOS transistor 6 that is the other half of a complementary pair.

The PMOS transistor 103*a* is one example of a resistive element. The source of the PMOS transistor 103*a* is connected to the high voltage power supply VDDH, the drain thereof is connected to the source of the PMOS transistor 103, and the gate thereof is connected to the gate of the PMOS transistor 103. When a signal of Low level is inputted into the gates of these PMOS transistors 103 and 103*a*, both of them are turned on and thus the ON-resistance between the drain and the source of the PMOS transistor 103*a* function as a load resistor of the PMOS transistor 103.

The circuit that is a combination of these PMOS transistor 103 and PMOS transistor 103*a* performs the same function as the PMOS transistor 3 in the first embodiment. In other words, in the present embodiment, the driving capability of the PMOS transistor 103 itself is equivalent to that of the NMOS transistor 6 that is the other half of the complementary pair. However, since the PMOS transistor 103*a* is connected as a load resistor for this PMOS transistor 103, the driving current (drain current that flows when the PMOS transistor 103 is ON) of the PMOS transistor 103 is limited. As a result, the driving current that flows through the PMOS transistor 103*a* and the PMOS transistor 103 is lower than the current that flows through the NMOS transistor 6.

Based on the above fact, the PDP driver in the present embodiment produces the same effects as those in the first embodiment. To be more specific, since the driving current of the NMOS transistor 6 is higher than that of the PMOS transistor 3, the ON state of the NMOS transistor 6 is securely maintained when the signal IN1 is High even if the voltage of the low voltage power supply drops as does it immediately after the power is turned off. Furthermore, since the driving current of the PMOS transistor 2 is higher than that of the NMOS transistor 5, the ON state of the PMOS transistor 2 is securely maintained, and as a result, the high voltage VDDH is supplied to the gate of the PMOS transistor 1 in the CMOS output unit 14, the OFF state of the PMOS transistor 1 is securely maintained, and therefore the flow of the pass-through current through the CMOS output unit 14 is avoided.

It should be noted that in the present embodiment, the gate of the PMOS transistor 103*a* is connected to the gate of the PMOS transistor 103, but the present invention is not limited to such connection. All that is required of the PMOS transistor 103*a* is function as a load resistor. The gate of the PMOS transistor 103*a* just has to be connected to a predetermined Low potential (for example, GND or the like).

Figure 13:
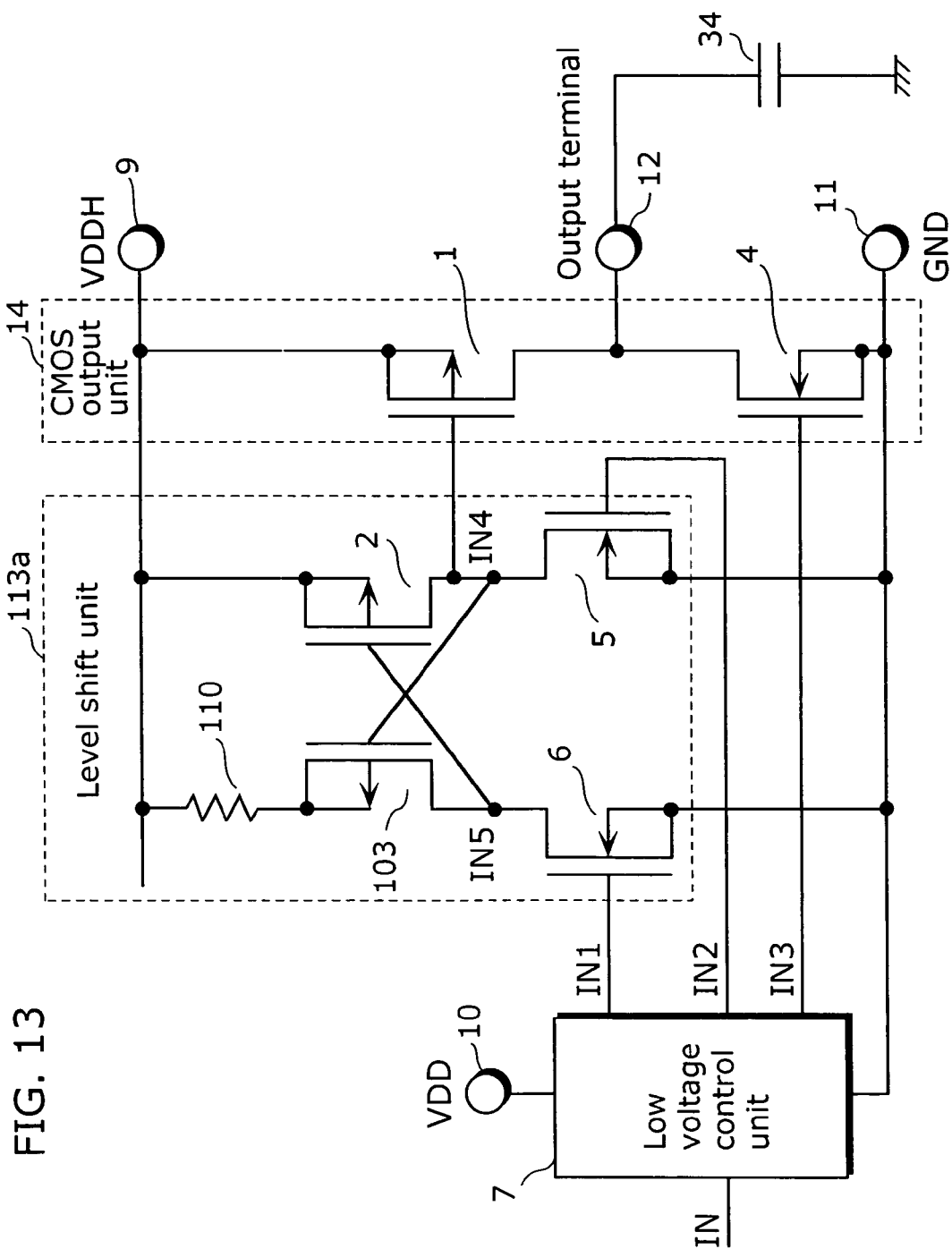
FIG. 13 is a structure diagram of a PDP driver in a modification of the third embodiment.

Like the level shift unit 113*a* shown in FIG. 13, the PMOS transistor 103*a* in the present embodiment may be substituted by a resistor 110 having the same resistance value, which allows suppression of the drain current that flows through the PMOS transistor 103.

Fourth Embodiment

Next, a structure of a PDP driver in the fourth embodiment is described with reference to FIG. 14.

Figure 14:
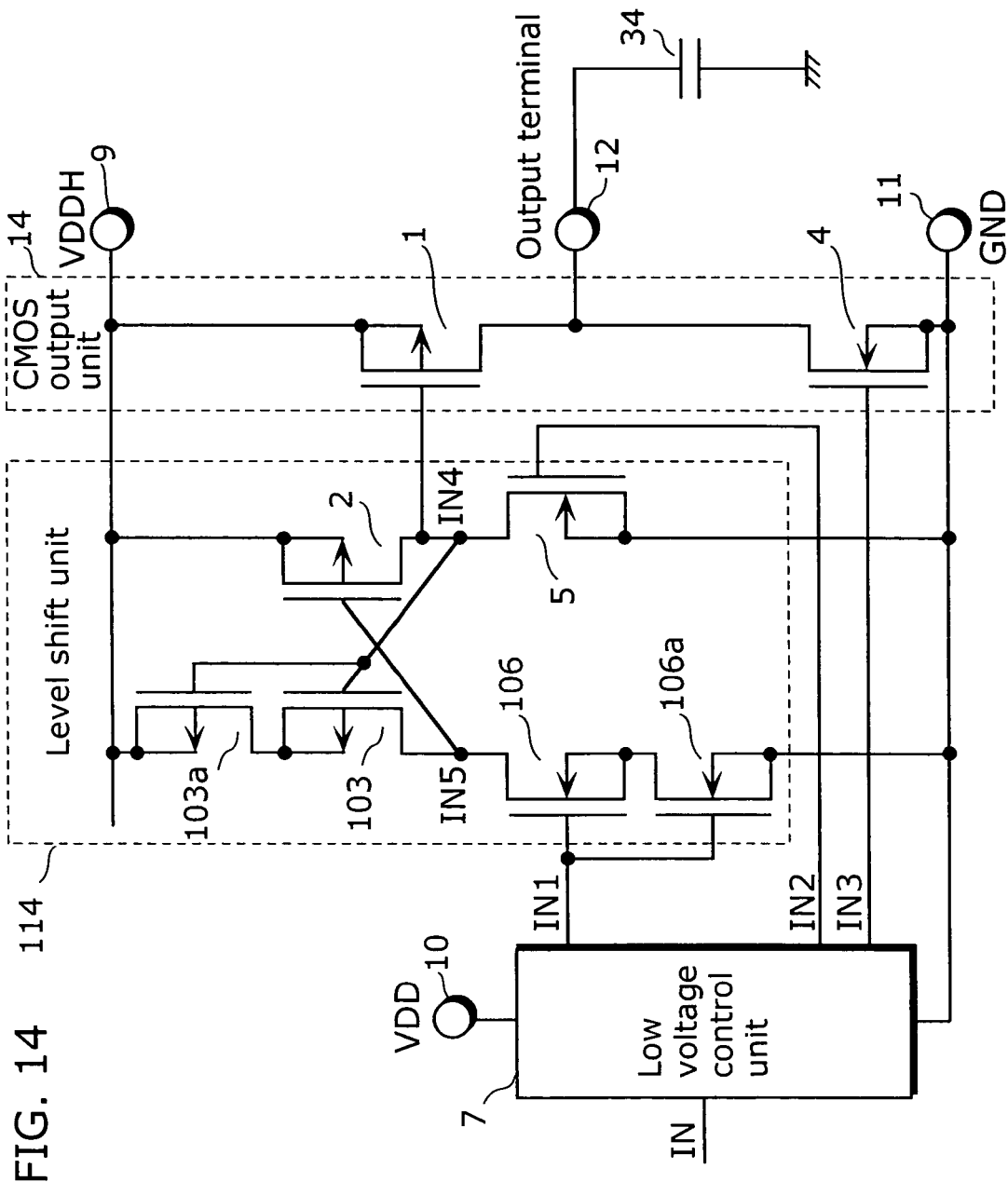
FIG. 14 is a structure diagram of a PDP driver in a fourth embodiment.

FIG. 14 is a structure diagram of the PDP driver in the fourth embodiment. The PDP driver in the fourth embodiment has the same structure as the PDP driver in the third embodiment except for a level shift unit 114.

The level shift unit 114 of the present embodiment corresponds to the circuit in which the NMOS transistor 6 in the level shift unit 113 of the third embodiment is substituted by an NMOS transistor 106 and an NMOS transistor 106*a*.

The NMOS transistor 106 is, for example, an NMOS transistor having the driving capability equivalent to that of the NMOS transistor 5 which is placed in the subsequent stage.

The NMOS transistor 106*a* is one example of a resistive element. The source of the NMOS transistor 106*a* is connected to the low voltage power supply VDD, the drain thereof is connected to the source of the NMOS transistor 106, and the gate thereof is connected to the gate of the NMOS transistor 106. When a signal of High level is inputted into the gates of these NMOS transistors 106 and 106a, both of them are turned on and thus the ON-resistance components between the drain and the source of the NMOS transistor 106a function as a load resistor of the NMOS transistor 106.

The circuit that is a combination of these NMOS transistor 106 and NMOS transistor 106a performs the same function as the NMOS transistor 6 in the third embodiment. In other words, in the present embodiment, the driving capability of the NMOS transistor 106 itself is equivalent to that of the NMOS transistor 5 that is placed in the subsequent stage. However, since the NMOS transistor 106a is connected as a resistive element for this NMOS transistor 106, the driving current (drain current that flows when the NMOS transistor 106 is ON) of the NMOS transistor 106 is limited. As a result, the driving current that flows through the NMOS transistor 106 and the NMOS transistor 106a is lower than the current that flows through the NMOS transistor 5.

It should be noted that the PMOS transistor 103a and the NMOS transistor 106a are designed so that the relationship between the driving currents of the PMOS transistor 103 and the NMOS transistor 106 becomes equal to that in the third embodiment. In other words, the driving current of the NMOS transistor 106 is higher than that of the PMOS transistor 103.

Based on the above, the PDP driver in the present embodiment produces the same effects as those in the first embodiment. To be more specific, since the driving current of the NMOS transistor 106 is higher than that of the PMOS transistor 103, the ON state of the NMOS transistor 106 is securely maintained when the signal IN1 is High even if the voltage of the low voltage power supply drops as does it immediately after the power is turned off. Furthermore, since the driving current of the PMOS transistor 2 is higher than that of the NMOS transistor 5, the ON state of the PMOS transistor 2 is securely maintained, and as a result, the high voltage VDDH is supplied to the gate of the PMOS transistor 1 in the CMOS output unit 14, the OFF state of the PMOS transistor 1 is securely maintained, and therefore the flow of the pass-through current through the CMOS output unit 14 is avoided.

It should be noted that in the present embodiment, the gate of the PMOS transistor 106a is connected to the gate of the NMOS transistor 106, but the present invention is not limited to such connection. All that is required of the NMOS transistor 106a is function as a load resistor. The gate of the NMOS transistor 106a just has to be connected to a predetermined high potential (for example, CDD or the like).

Figure 15:
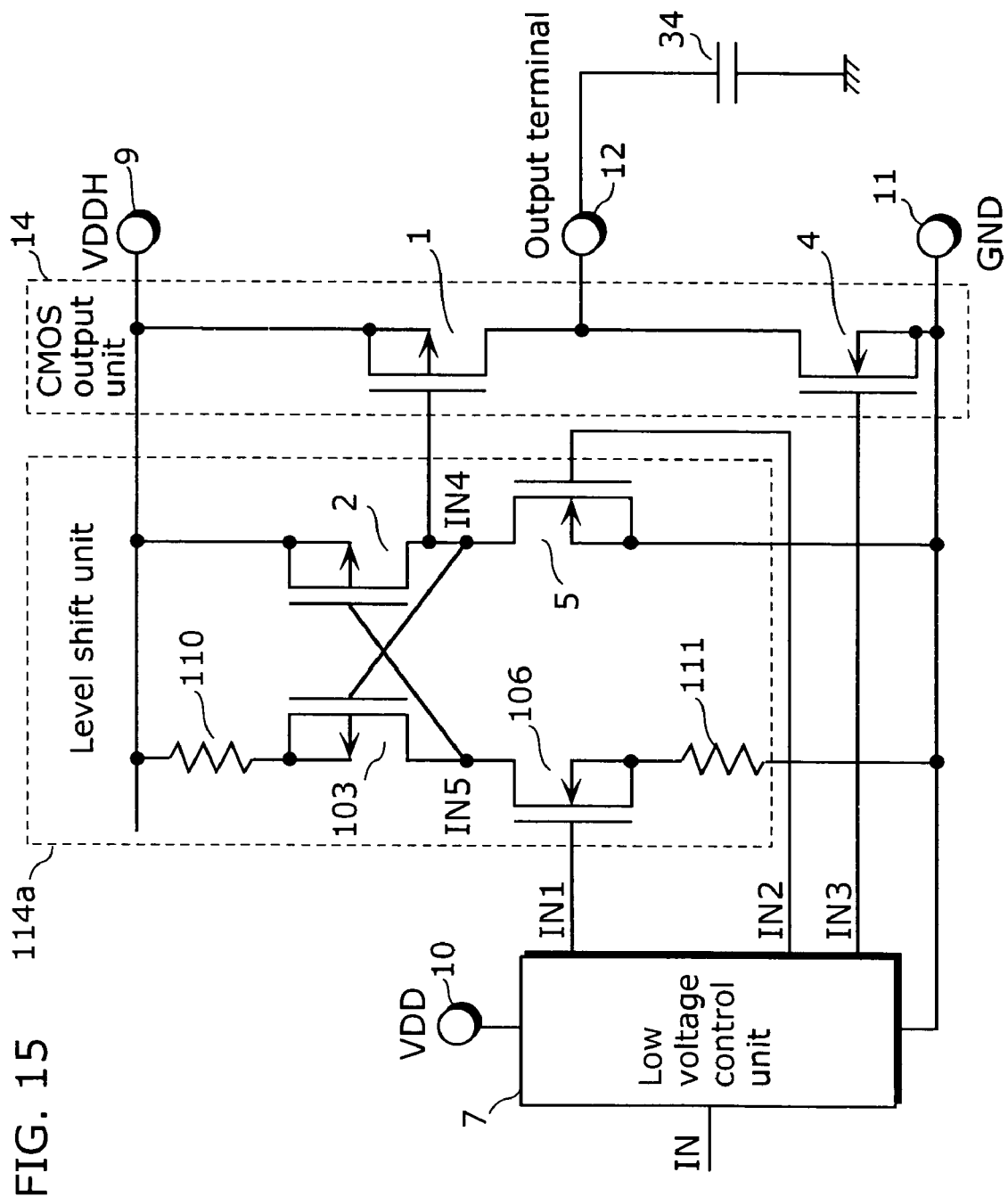
FIG. 15 is a structure diagram of a PDP driver in a modification of the fourth embodiment.

Like the level shift unit 114a shown in FIG. 15, the NMOS transistor 106a in the present embodiment may be substituted by a resistor 111 having the same resistance value, which allows suppression of the drain current that flows through the NMOS transistor 106.

Although the driver circuit of the present invention has been described in detail based on the above first to fourth embodiments, those skilled in the art will readily appreciate that many modifications are possible in these exemplary embodiments without materially departing from the novel teachings and advantages of this invention. Accordingly, all such modifications are intended to be included within the scope of this invention.

For example, the PMOS transistor 3 of the first embodiment is substituted by the PMOS transistor 103 and the PMOS transistor 103a in the third embodiment, and the NMOS transistor 6 is additionally substituted by the NMOS transistor 106 and the NMOS transistor 106a in the fourth embodiment. However, the present invention is not limited to such substitutions of these transistors. The PMOS transistor 2 and the NMOS transistor 5 may also be substituted in the same manner. Furthermore, the four MOS transistors in the level shift unit may be substituted by a combination of any of these MOS transistors and a resistor. In short, each MOS transistor may be implemented singly or in combination with a resistive element (a MOS transistor or a resistor), as long as respective MOS transistors are designed so that the driving capabilities of the PMOS transistor 3, the NMOS transistor 6, the NMOS transistor 5 and the PMOS transistor 2 increase in that order, from lowest to highest.

Furthermore, the above first to fourth embodiments have been described taking as an example the case of using the push-pull output unit (CMOS output unit 14) in which the PMOS transistor 1 and the NMOS transistor 4 are connected in series between the high voltage power supply (VDDH) and the ground potential (GND). However, the present invention is not limited to this case, and may be implemented using a push-pull output unit in which two transistors of the same type (for example, NMOS transistors, PMOS transistors, bipolar transistors, or IGBTs (insulated gate bipolar transistors)) are connected in series and the polarity of one of the control signals of the transistor on the side of the high voltage power supply (VDDH) and the transistor on the side of the ground potential (GND) is reversed.

INDUSTRIAL APPLICABILITY

The driver circuit according to the present invention is useful as a driver circuit for outputting a high voltage driving signal, and in particular, as a PDP driver or the like for driving a plasma display panel.

What is claimed is:
1. A driver circuit, comprising:
a level shift unit including a first P-channel metal-oxide semiconductor (PMOS) transistor, a second PMOS transistor, a first N-channel metal-oxide semiconductor (NMOS) transistor and a second NMOS transistor,
wherein a source, a drain and a gate of said first PMOS transistor are respectively connected to a high voltage power supply, a first contact and a second contact,
a source, a drain and a gate of said second PMOS transistor are respectively connected to the high voltage power supply, the second contact and the first contact,
a source of said first NMOS transistor is grounded, a drain of said first NMOS transistor is connected to the first contact, and a gate of said first NMOS transistor receives a first signal, and
a source of said second NMOS transistor is grounded, a drain of said second NMOS transistor is connected to the second contact, and a gate of said second NMOS transistor receives a second signal;
a low voltage control unit, which is connected to a low voltage power supply, operable to output, according to an input signal, the first signal to the gate of said first NMOS transistor and the second signal to the gate of said second NMOS transistor; and
a push-pull output unit operable to perform a switching operation based on a signal at the first contact of said level shift unit and a third signal outputted from said low voltage control unit, wherein a driving current of said first PMOS transistor is higher than a driving current of said first NMOS transistor.

2. The driver circuit of claim 1,
wherein the driving current of said first NMOS transistor is higher than a driving current of said second NMOS transistor, and
the driving current of said second NMOS transistor is higher than a driving current of said second PMOS transistor.

3. The driver circuit of claim 1,
wherein a driving capability of said first PMOS transistor is higher than a driving capability of said first NMOS transistor.

4. The driver circuit of claim 3,
wherein the driving capability of said first NMOS transistor is higher than a driving capability of said second NMOS transistor, and
the driving capability of said second NMOS transistor is higher than a driving capability of said second PMOS transistor.

5. The driver circuit of claim 1, further comprising:
a first resistive element which is connected between the high voltage power supply and the source of said second PMOS transistor,
wherein the source of said second PMOS transistor is connected to the high voltage power supply via said first resistive element.

6. The driver circuit of claim 5,
wherein said first resistive element is a PMOS transistor.

7. The driver circuit of claim 5, further comprising:
a second resistive element which is connected between the source of said second NMOS transistor and a ground potential,
wherein the source of said second NMOS transistor is grounded via said second resistive element.

8. The driver circuit of claim 7,
wherein said second resistive element is an NMOS transistor.

9. The driver circuit of claim 1, further comprising;
a power supply voltage detection circuit operable to detect a voltage which is supplied by the low voltage power supply, and to output a control signal to said low voltage control unit in the case where the detected voltage changes from a voltage, which is at least equal to a first voltage, to a second voltage that is lower than the first voltage,
wherein when receiving the control signal, said low voltage control unit is operable to output the second signal which causes said second NMOS transistor to be turned off.

10. The driver circuit of claim 1, wherein a drain current of said first PMOS transistor that flows when said first PMOS transistor is ON is higher than a drain current of said first NMOS transistor that flows when said first NMOS transistor is ON.

11. The driver circuit of claim 1, wherein a mutual conductance of said first PMOS transistor is larger than a mutual conductance of said first NMOS transistor.

12. The driver circuit of claim 1, wherein a gate width of said first PMOS transistor is larger than a gate width of said first NMOS transistor.

13. The driver circuit of claim 1, wherein a gate length of said first PMOS transistor is less than a gate length of said first NMOS transistor.

* * * * *